(12) United States Patent
Ang et al.

(10) Patent No.: US 6,599,764 B1
(45) Date of Patent: Jul. 29, 2003

(54) ISOLATION TESTING SCHEME FOR MULTI-DIE PACKAGES

(75) Inventors: Boon Jin Ang, Penang (MY); Sammy Cheung, Pleasanton, CA (US); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 57 days.

(21) Appl. No.: 09/870,354

(22) Filed: May 30, 2001

(51) Int. Cl.[7] .................... H01L 21/66; H01L 23/52; G01R 31/27
(52) U.S. Cl. .................. 438/15; 438/17; 324/765; 257/725
(58) Field of Search .................. 438/14, 15, 17, 438/18; 324/765; 365/201; 257/48, 725

(56) References Cited

U.S. PATENT DOCUMENTS 5,796,746 A * 8/1998 Farnworth et al. .......... 714/718
6,240,535 B1 * 5/2001 Farnworth et al. .......... 714/718
6,351,681 B1 * 2/2002 Chih et al. ................. 324/765

FOREIGN PATENT DOCUMENTS

WO     WO 98/12706    * 3/1998

* cited by examiner

*Primary Examiner*—Evan Pert
(74) *Attorney, Agent, or Firm*—Morrison & Foerster LLP

(57) ABSTRACT

A test platform is configured to test a mult-die package having at a first die and a second die. The test platform includes a first lead that is connected to the VCC input on the first die. The test platform also includes a second lead that is connected to VCCIO input on the second die. The VCC input on the second die is connected to ground. The I/O pin of the second die can then be tri-stated using a control circuit disposed between the pre-driver and the driver of the I/O buffer.

20 Claims, 11 Drawing Sheets

ISOLATION TESTING SCHEME FOR MULTI-DIE PACKAGES

BACKGROUND OF THE INVENTION

1. Field of the Invention

The present invention generally relates to testing multi-die packages and more particularly to isolating individual die in multi-die packages during testing.

2. Description of the Related Art

Integrated-circuit dice are typically subjected to a series of test procedures to ensure reliability. This can include electrical-characteristics testing, logic testing, and burn-in testing. In electrical-characteristics testing, a die can be tested for electrical parameters, such as input and output voltages, capacitances, and currents for the integrated circuits contained on the die. Logic tests are generally performed on a die that contains logic components, such as memory, state-machines, and the like. In logic testing, the die can be tested to measure its response to certain input stimulus. In burn-in testing, a die is typically overstressed. For example, the die can be subjected to higher than normal operating temperatures and voltages to verify its lifetime.

To perform these testing procedures, a die is typically mounted on a test/burn-in board. These boards form temporary connection with contacts on the packaged die. They also provide connections for a tester to provide test signals to the packaged die.

Over the years, multi-die packages that contain two or more dice have become increasing popular. More particularly, multi-die packages with a FLASH die have been in great demand for use in portable-electronic devices, such as cell phones, personal electronic devices, and the like.

In testing multi-die packages, it is desirable to test one die while other dice are isolated. In generally, this is achieved in part with test boards that are specifically configured for a particular set of dice in a multi-die package. As such, one board that is configured to test one set of dice in a multi-die package may not be used to test a different set of dice. Thus, when one die in a multi-die package is changed, a new test board may be required. This can be both cost and time prohibitive.

SUMMARY OF THE INVENTION

The present invention relates to testing a multi-die package. In accordance with one aspect of the present invention, the multi-die package includes a first die and a second die. The first die and the second die each have a VCC input. The second die also has a VCCIO input. The second die also includes at least one I/O pin connected to an I/O buffer having a driver and a pre-driver. In one embodiment of the present invention, the multi-die package is inserted/disposed in a test platform having a first and a second lead. The first lead is connected to the VCC input on the first die. The second lead is connected to the VCCIO input on the second die. The VCC input on the second die is connected to ground. The I/O pin of the second die is tri-stated using a control circuit disposed between the pre-driver and the driver of the I/O buffer.

DESCRIPTION OF THE DRAWING FIGURES.

The present invention can be best understood by reference to the following description taken in conjunction with the accompanying drawing figures, in which like parts may be referred to by like numerals:

DETAILED DESCRIPTION

The present invention relates to testing multi-die packages. In order to provide a more thorough understanding of the present invention, the following description sets forth numerous specific details, such as specific configurations, parameters, and the like. It should be recognized, however, that such description is not intended as a limitation on the scope of the present invention, but is intended to provide a better description of exemplary embodiments.

Figure 1:
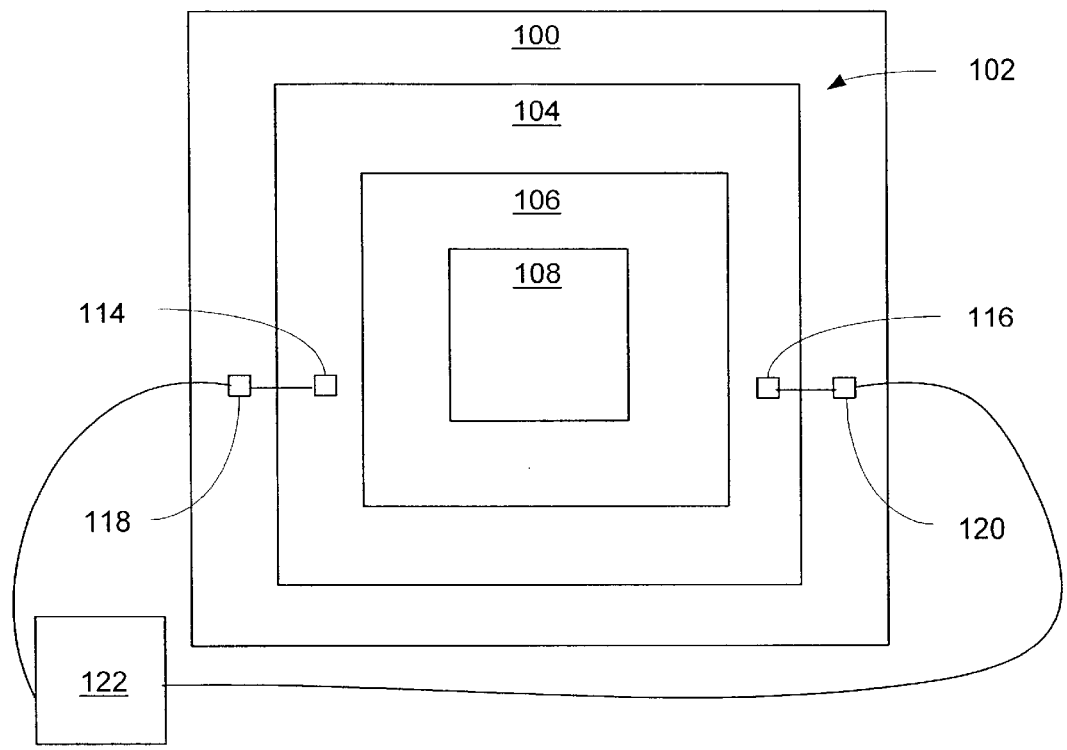
FIG. 1 is a top view of a multi-die package disposed in a test platform.
Figure 2:
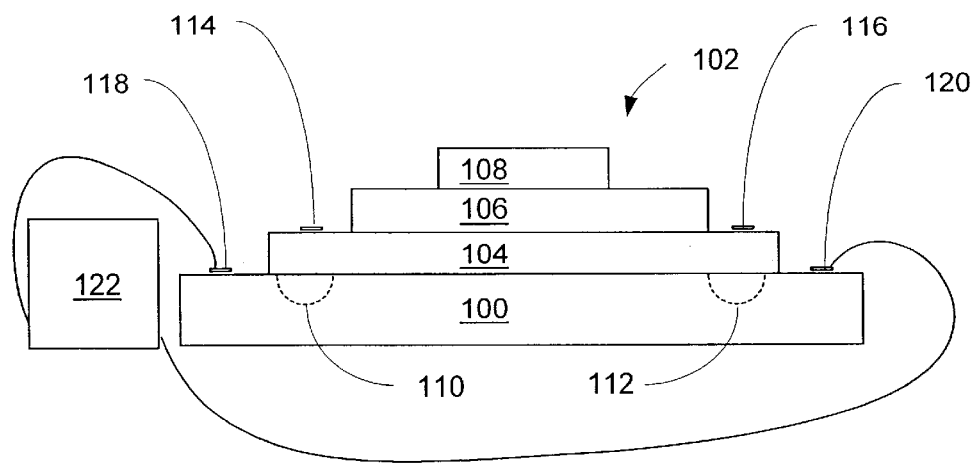
FIG. 2 is a side view of the multi-die package and the test platform shown in FIG. 1.

With reference to FIGS. 1 and 2, a multi-die package 102 includes a substrate 104, a first die 106, a second die 108, a first pin 110, a second pin 112, a first-bonding terminal 114, and a second-bonding terminal 116. First die 106 and second die 108 are mounted on substrate 104. For illustrative purposes, assume that first die 106 is connected to first pin 110 and first-bonding terminal 114. Similarly, assume that second die 108 is connected to second pin 112 and second-bonding terminal 116. It should be recognized that this association of pins and bonding terminals to dice can vary depending on the particular application. Similarly, it should be recognized that multi-die package 102 can include any number of dice, pins, and bonding terminals. Furthermore, pins 110 and 112 can include any type of connectors, such as solder balls.

Figure 3A:
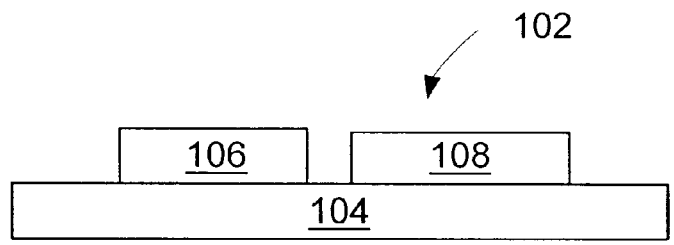
FIG. 3A is a side view of an alternative configuration of a multi-die package.
Figure 3B:
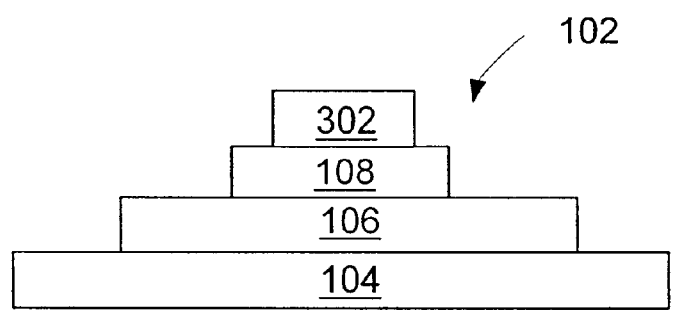
FIG. 3B is a side view of another alternative configuration of a multi-die package.
Figure 3C:
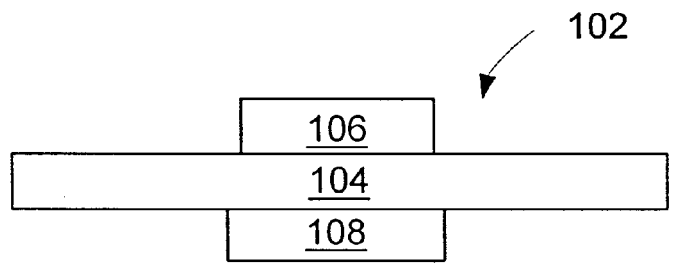
FIG. 3C is a side view of still another alternative configuration of a multi-die package.

In FIGS. 1 and 2, first die 106 and second die 108 are depicted in a stacked configuration. It should be recognized, however, that multi-die package 102 can include any number of dice mounted in any number of configurations. For example, with reference to FIGS. 3A–3C, various exemplary alternative configurations of multi-die package 102 are depicted. More particularly, FIG. 3A depicts a multi-die package 102 that includes first die 106 and second die 108 mounted in a side-by-side configuration on substrate 104. FIG. 3B depicts a multi-die package 102 that includes a third die 302 mounted on top of second die 108 in a stacked configuration. FIG. 3C depicts a multi-die package 102 that includes first die 106 and second die 108 mounted on opposite sides of substrate 104.

With reference again to FIGS. 1 and 2, a test platform 100 is configured to test multi-die package 102. For the sake of clarity, test platform 100 is depicted as a single board configured to receive multi-die package 102. It should be recognized, however, that test platform 100 can include a test board, a burn-in board, a combination test and burn-in board, and the like.

To test multi-die package 102, test platform 100 is configured to receive multi-die package 102 and to connect it to a tester 122. More particularly, as depicted in FIGS. 1 and 2, test platform 100 includes a first lead 118 and a second lead 120 that connect to first-bonding terminal 114 and second-bonding terminal 116, respectively. More particularly, first lead 118 can be connected to first-bonding terminal 114 through first pin 110. Second lead 120 can be connected to second-bonding terminal 116 through second pin 112. First lead 118 and second lead 120 then connect test platform 100 to tester 122. In this manner, signals from tester 122 can be transmitted to and received from first die 106 and second die 108. Tester 122 can then perform various test procedures, such as logic testing, electrical-characteristics testing, burn-in testing, and the like.

As described above, for illustrative purposes, first-bonding terminal 114 and second-bonding terminal 116 are assumed to be connected to first die 106 and second die 108, respectively. As such, tester 122 can send and receive signals to and from first die 106 and second die 108 using first lead 118 and second lead 120, respectively. It should be recognized, however, that test platform 100 can include any number of leads connected to any number of bonding terminals in any number of configurations. Additionally, it should be recognized that tester 122 can be connected to any number of dice in any number of configurations. For example, tester 122 can be connected to first die 106 and second die 108 using first pin 110 and second pin 112, respectively. Additionally, tester 122 can be configured either on test platform 100 or substrate 104.

Figure 4:
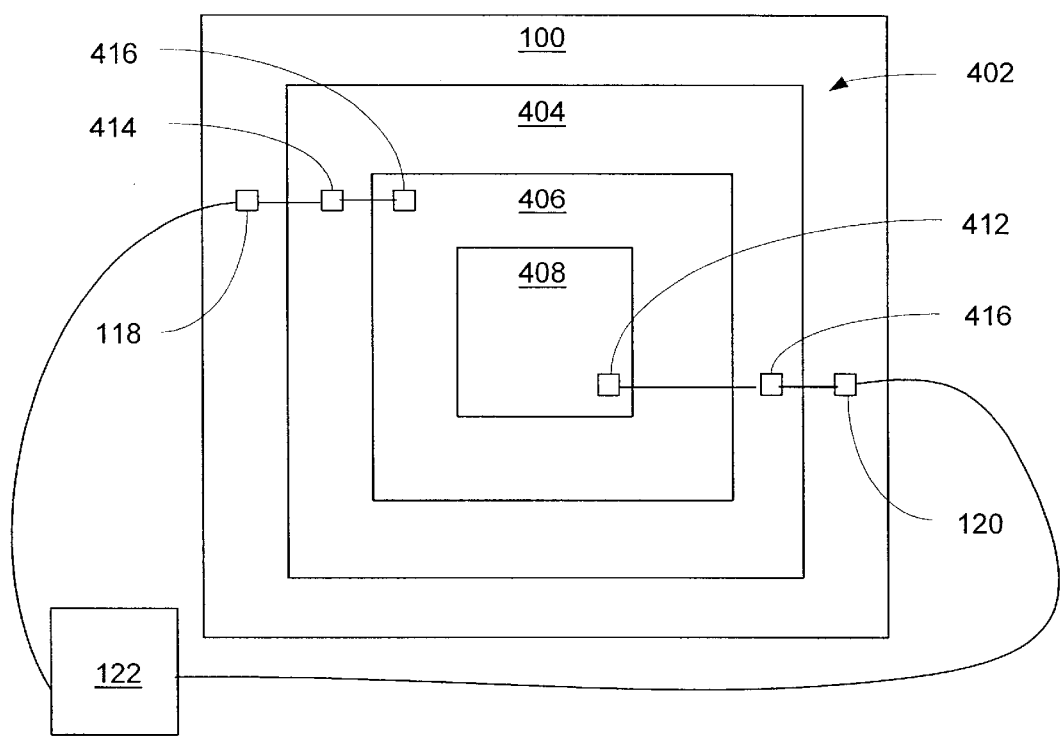
FIG. 4 is a top view of another multi-die package disposed in the test platform.

With reference now to FIG. 4, in one application of the present invention, test platform 100 is configured to test a multi-die package 402 that includes a FLASH die 406 and an SRAM die 408 mounted on a substrate 404. For example, multi-die package 402 can include FLASH die 406 and SRAM die 408 in a stacked-CSP package, which is available from Sharp Corporation of Osaka, Japan. It should be recognized, however, that multi-die package 402 can include various configurations of FLASH die 406 and SRAM die 408 depending on the particular application. Additionally, it should be recognized that multi-die package 402 can include various memory devices other than FLASH die 406 and SRAM die 408.

As alluded to earlier, to test multi-die package 402, test platform 100 is configured to receive multi-die package 402 and to connect it to tester 122. More particularly, assume that a first-bonding terminal 414 on substrate 404 is connected to FLASH die 406, and that a second-bonding terminal 416 on substrate 404 is connected to SRAM die 408. As depicted in FIG. 4, first lead 118 and second lead 120 connect to first-bonding terminal 414 and second-bonding terminal 416, respectively. As described earlier and depicted in FIG. 2 with regard to another embodiment, first lead 118 and second lead 120 can be connected to first-bonding terminal 414 and second-bonding terminal 416 through pins/balls disposed on substrate 404. In this manner, tester 122 can send and receive signals to and from FLASH die 406 and SRAM die 408.

As also alluded to earlier, in testing multi-die package 402, it can be desirable to test FLASH die 406 and SRAM die 408 in isolation. For example, to test FLASH die 406, SRAM die 408 can be isolated. As such, first lead 118 and second lead 120 can be connected to separate channels in tester 122. Then, first lead 118 can send and receive signals to and from FLASH die 406, and second lead 120 can send and receive signals to and from SRAM die 408. For example, assume that first-bonding terminal 414 is connected to a VCC-input 416 on FLASH die 406, and second-bonding terminal 416 is connected to a VCC-input 412 on SRAM die 408. In this manner, tester 122 can provide power to FLASH die 406 independently from SRAM die 408.

To isolate SRAM die 408 while testing FLASH die 406, leads connected to the outputs of SRAM die 408 can be de-asserted while driving the inputs of FLASH die 406. More particularly, in one embodiment, SRAM die 408 and FLASH die 406 can be configured to receive both control signals and I/O signals. Tester 122 can be configured to provide separate control signals for FLASH die 406 and SRAM die 408. For example, tester 122 can provide one enable signal for FLASH die 406 and a separate enable signal for SRAM die 408. As such, FLASH die 406 and SRAM die 408 can be isolated by not enabling both of these signals at the same time.

Additionally, SRAM die 408 and FLASH die 406 can be configured with shared Input/Output (I/O) pins. If these I/O pins are not isolated, contention can result between SRAM die 408 and FLASH die 406. As described above, in the present embodiment, SRAM die 408 and FLASH die 406 can receive separate control signals. As such, contention between SRAM die 408 and FLASH die 406 can be prevented utilizing these separate control signals.

Figure 5:
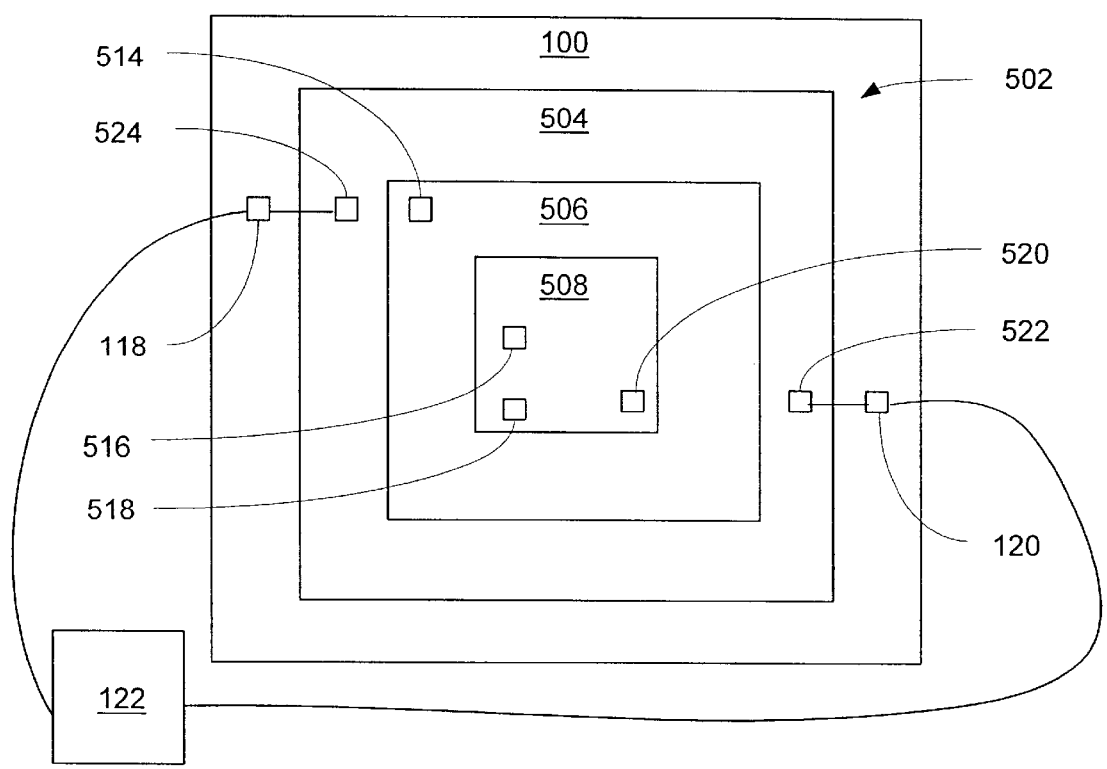
FIG. 5 is a top view of still another multi-die package disposed in the test platform.

With reference now to FIG. 5, in accordance with another application, test platform 100 can be configured to test a multi-die package 502 that includes a FLASH die 506 and a controller die 508 mounted on a substrate 504. For example, FLASH die 506 and controller die 508 in a stacked-CSP package is available from Altera Corporation of San Jose, Calif. U.S.A. It should be recognized, however, that multi-die package 502 can include various configurations of FLASH die 506 and controller die 508 depending on the particular application. Additionally, it should be recognized that multi-die package 502 can include various memory devices other than FLASH die 506, and various controllers, including ASIC (Application-Specific Integrated Circuit) controllers, PLD (Programmable Logic Device) controllers, and the like.

As alluded to earlier, to test multi-die package 502, test platform 100 receives multi-die package 502 and connects it to tester 122. In the present application, however, multi-die package 502 includes controller die 508 rather than SRAM die 408 (FIG. 4). As depicted in FIG. 5, controller die 508 can include a VCC input 516, a VCCIO input 518, and a test-mode-entry-enable (TM) input 520.

Additionally, FLASH die 506 and controller die 508 can include any number of Input/Output (I/O) pins. These I/O pins include I/O buffers with pre-drivers and drivers connected to the I/O pins. As alluded to earlier, FLASH die 506 and controller die 508 can share I/O pins. As also alluded to earlier, if these shared I/O pins are not isolated during testing, contention can result between FLASH die 506 and controller die 508. It should be recognized that these I/O pins can include various types of connectors, such as solder balls.

As depicted in FIG. 5, test platform 100 includes first lead 118 and second lead 120. More particularly, as described above with regard to one application of the present invention, first lead 118 and second lead 120 can be configured as VCC leads. With reference to FIG. 4, first lead 118 was configured as the VCC lead for FLASH die 406, and second lead 420 was configured as the VCC lead for SRAM die 408.

With reference again to FIG. 5, as described above, controller 508 includes VCCIO input 518 in addition to VCC input 516. As test platform 100 was configured to connect to SRAM die 408 (FIG. 4), it can lack a VCCIO channel. But if power is not supplied to VCCIO input 518 (i.e., VCCIO=0 volts), the Input/Output (I/O) buffers of controller 508 can turn-on when the I/O pins are driven high by tester 122.

Additionally, test platform 100 and/or tester 122 can lack a channel or lead to TM input 520. Furthermore, during various testing procedures, some inputs on FLASH die 506 can be driven to high voltages (e.g., about 5 volts, about 12 volts, and the like). But the I/O buffers of controller die 508 may not tolerate these high voltages. As such, a new test platform is typically needed to test multi-die package 502. But this can be both cost and time prohibitive.

Figure 6:
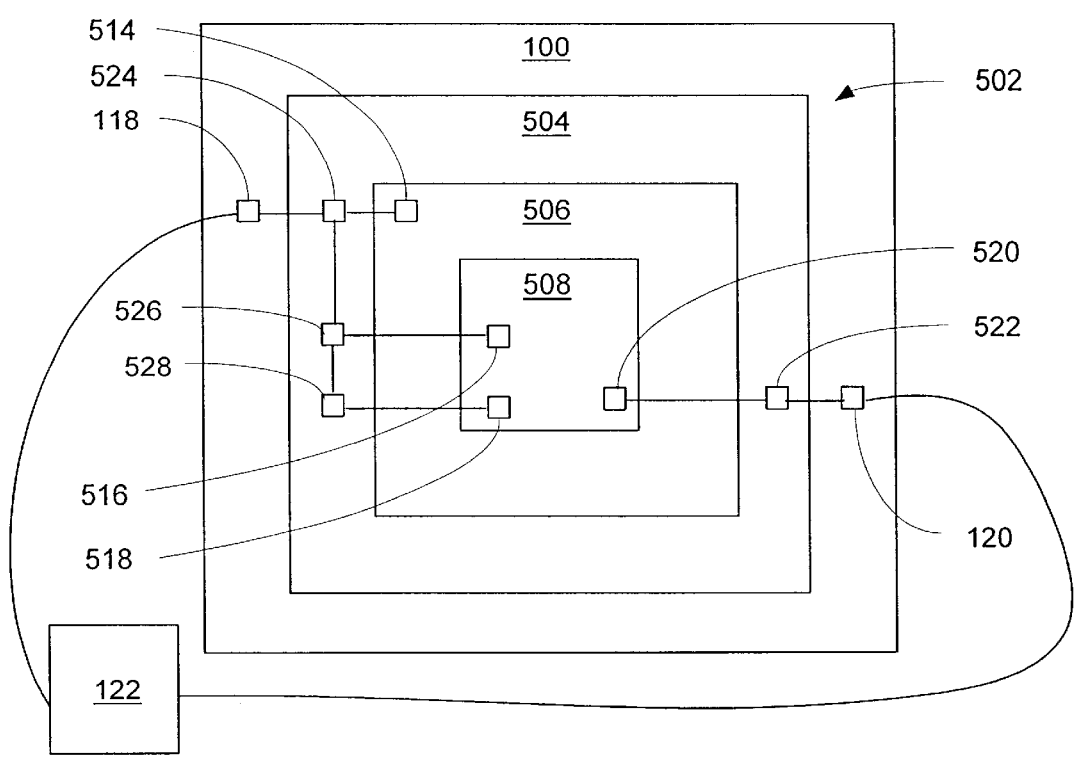
FIG. 6 is a top view of one configuration of the multi-die package and test platform shown in FIG. 5.

As such, with reference to FIG. 6, in one exemplary embodiment of the present invention, test platform 100, which was configured to test FLASH die 406 (FIG. 4) and SRAM die 408 (FIG. 4), can be re-configured to test FLASH die 506 and controller die 508. More particularly, VCC input 516 and VCCIO input 518 on controller die 508 and VCC input 514 on FLASH die 506 are connected together to first lead 118.

As depicted in FIG. 6, in the present embodiment, VCC input 514 on FLASH die 506 can be connected to first-bonding terminal 524 on substrate 504. VCC input 516 on controller die 508 can be connected to a first N.C. (No Contact) bonding terminal 526 on substrate 504. VCCIO input 518 on controller die 508 can be connected to a second N.C. bonding terminal 528 on substrate 504. These N.C. bonding terminals (i.e., terminals 526 and 528) can be connected on substrate 504 to first-bonding terminal 524. However, they are not directly connected to any lead on test platform 100, and are allowed to float.

With continued reference to FIG. 6, first lead 118 can then be connected to first-bonding terminal 524 to supply power to VCC input 514 on FLASH die 506 and VCC input 516 and VCCIO input 518 on controller die 508. In this same manner, the VSS and VSSIO inputs (not shown) of controller die 508 and the VSS input (not shown) of FLASH die 406 can also be connected.

Additionally, in the present embodiment, second lead 120 can be connected to TM input 520 on controller die 506. More particularly, as depicted in FIG. 6, TM input 520 can be connected to second-bonding terminal 522. Second lead 120 can then be connected to second-bonding terminal 522. In this manner, tester 122 can put controller die 506 into test mode using second lead 120, which was earlier configured as a VCC lead line for SRAM die 408 (FIG. 4).

As alluded to earlier, it can be desirable to isolate controller die 508 while testing FLASH die 506. In the present embodiment, as depicted in FIG. 6, VCC input 514 on FLASH die 506 and VCC input 516 and VCCIO input 518 on controller die 508 are connected together. As such, they receive the same power supply. Thus, controller die 508 cannot be isolated while FLASH die 506 is electrical-characteristics tested, as electrical-characteristics testing can require that controller die 508 and FLASH die 506 be supplied with independent power supplies. However, various non-electrical-characteristics tests can be performed on FLASH die 508 that do not require independent power to be supplied to controller die 508 and FLASH die 506. For example, logic testing can be performed on FLASH die 508.

Figure 7:
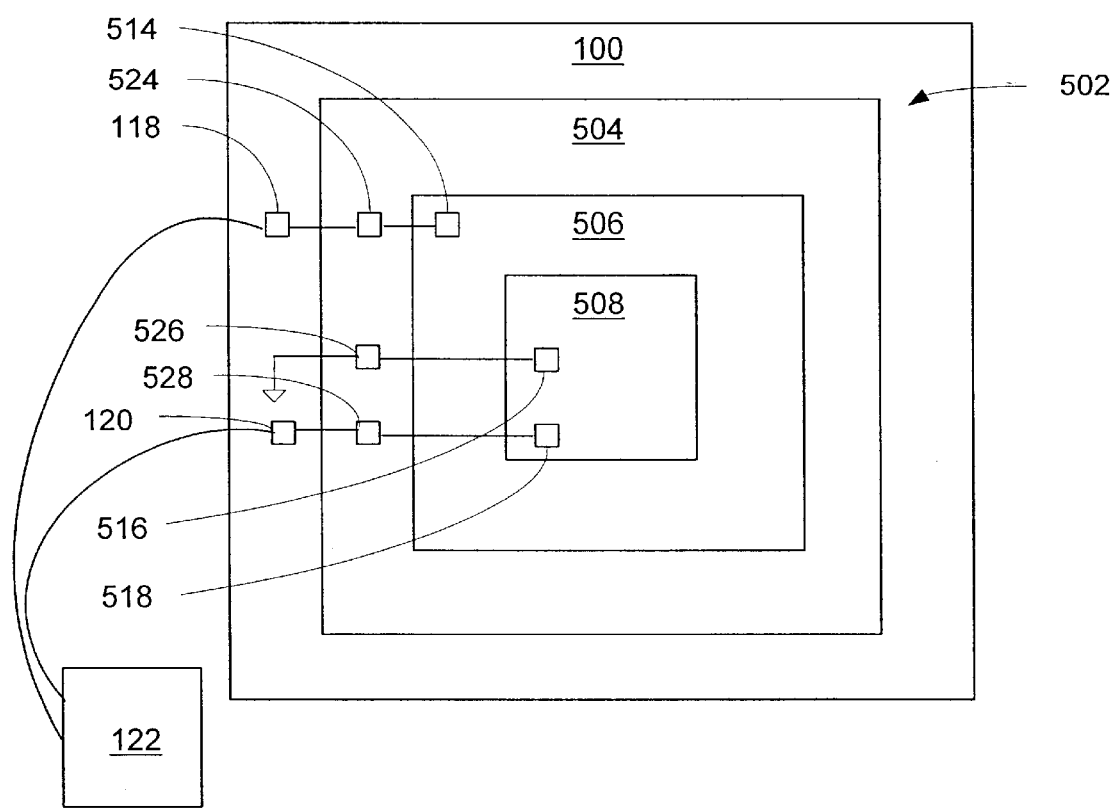
FIG. 7 is a top view of another configuration of the multi-die package and test platform shown in FIG. 5.

With reference now to FIG. 7, in another exemplary embodiment of the present invention, test platform 100 can be configured to isolate controller die 508 while testing FLASH die 506. As depicted in FIG. 7, VCC input 514 on FLASH die 508 can be connected to first lead 118. VCC input 516 on controller die 506 can be connected to ground. Thus VCC input 516 need not be connected to a channel on tester 122. Instead, they can be connected to any lead on test platform 100 that is at zero volts. Additionally, VCCIO input 518 on controller die 518 can be connected to second lead 120. Thus, in the present embodiment, controller die 508 can be isolated by grounding VCC input 516 on controller die 508 while supplying power to VCC input 514 on FLASH die 506 and VCCIO input 518 on controller 508.

Figure 8:
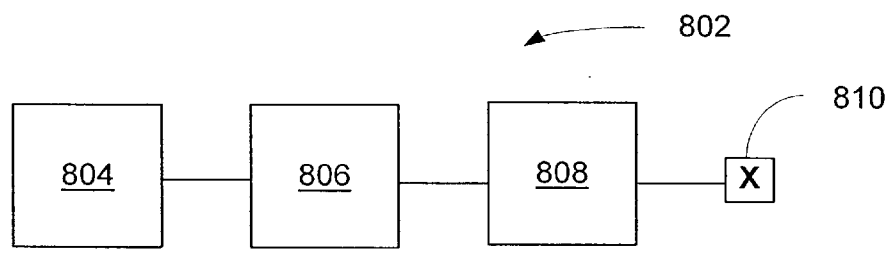
FIG. 8 is a block diagram of a portion of the multi-die package and test platform shown in FIG. 7.

More particularly, with reference to FIG. 8, an Input/Output (I/O) buffer 802 is configured to tri-state I/O pin 810. In the present embodiment, I/O buffer 802 includes a control circuit 806 disposed between a pre-driver circuit 804 and a driver 808. As alluded to earlier, it should be recognized that controller die 518 (FIG. 7) can include any number of I/O pins 810. Additionally, it should be recognized that I/O pins 810 can include various types of connectors, such as solder balls.

Figure 9:
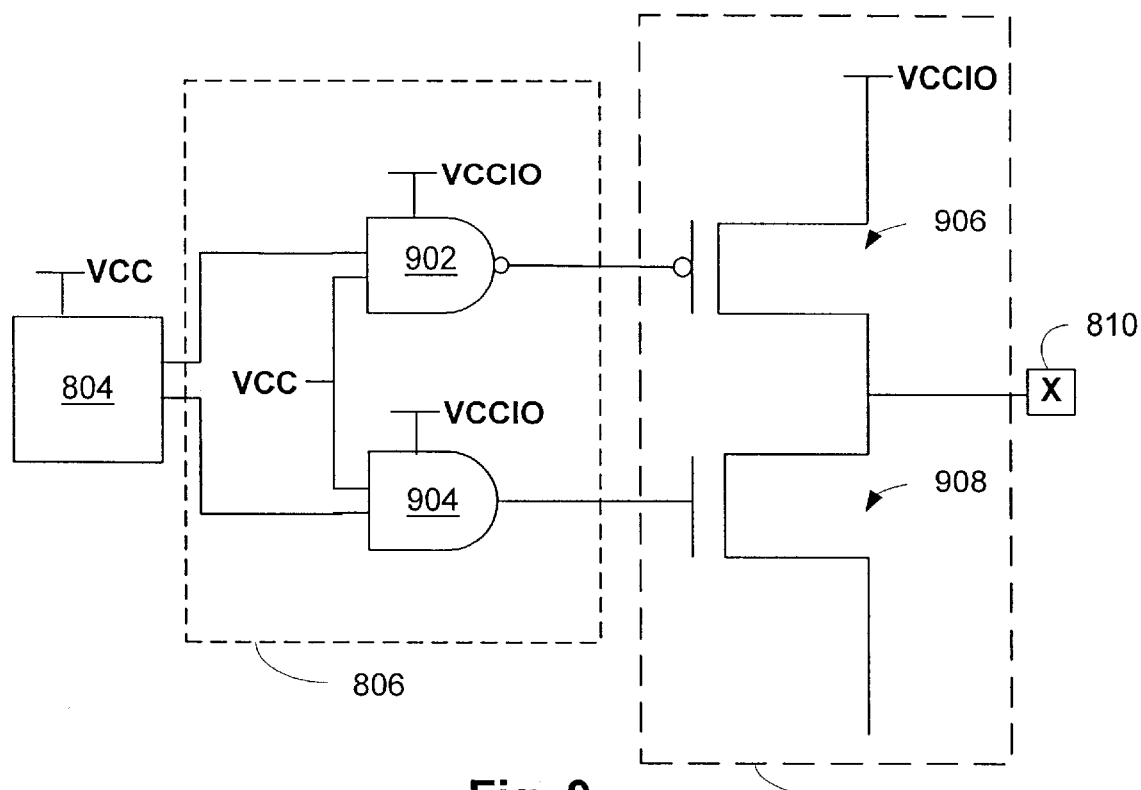
FIG. 9 is a partial block and circuit diagram of another portion of the multi-die package and test platform shown in FIG. 7.

With reference now to FIG. 9, in one configuration, driver 808 includes a p-channel transistor 906 and an n-channel transistor 908. Control circuit 806 includes a NAND gate 902 connected to p-channel transistor 906, and an AND gate 904 connected to n-channel transistor 908. As such, in the present configuration, when VCC input 516 (FIG. 7) on controller die 508 (FIG. 7) is grounded, I/O buffer 802 (FIG. 8) tri-states I/O pin 810. More particularly, in the present configuration, NAND gate 902 and AND gate 904 of control circuit 806 turns off p-channel transistor 906 and n-channel transistor 908 of driver 808. In this manner, all of the I/O pins of controller die 508 (FIG. 7) can be tri-stated. It should be recognized, however, that control circuit 806 can include various additional circuit elements including those with the same logic function as depicted in circuit 806.

As depicted in FIG. 9, in the present embodiment, control circuit 806 is powered by VCCIO rather than VCC. In the present embodiment, VCCIO is about 3.3 volts and VCC is about 0 volts. However, this can be disadvantageous in some non-testing applications during normal mode since VCCIO can be noisier than VCC.

Figure 10:
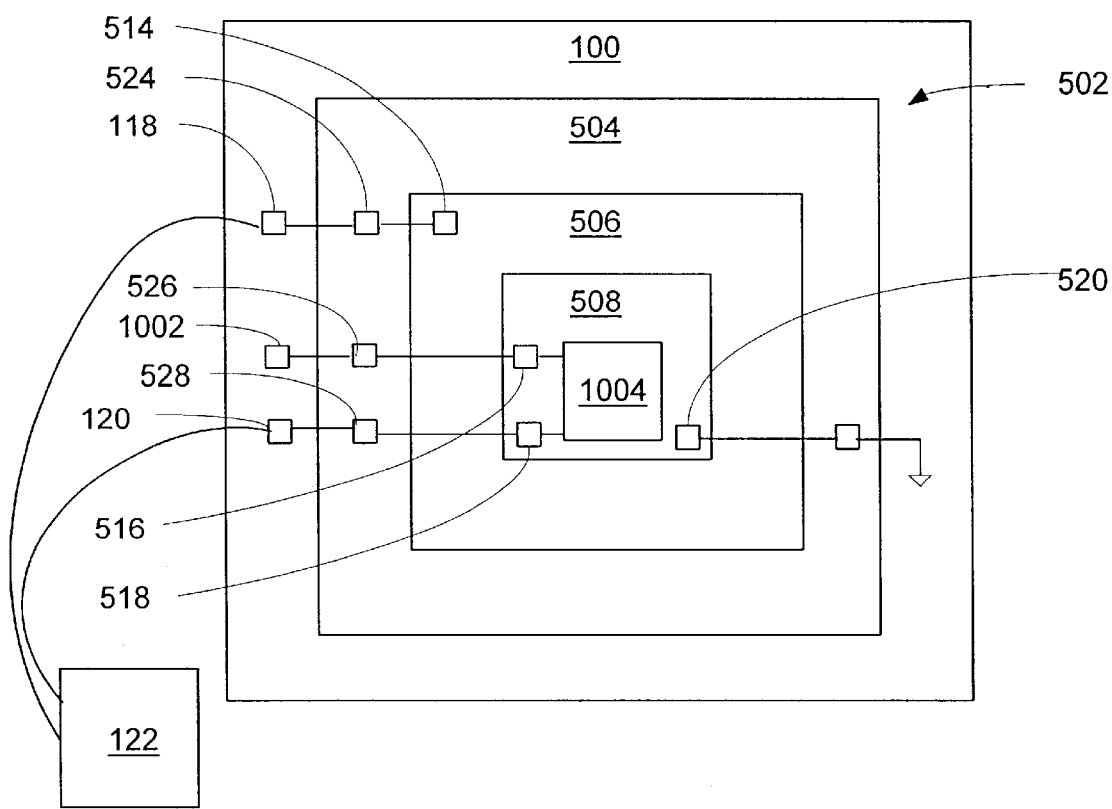
FIG. 10 is a top view of another configuration of the multi-die package and test platform shown in FIG. 5.

As such, with reference now to FIG. 10, in accordance with another embodiment of the present invention, controller die 508 includes a switch circuit 1004 disposed between VCC input 516 and VCCIO input 518. As depicted in FIG. 10, TM input 520 is grounded on test platform 100. In the present embodiment, TM input 520 senses the test mode and enables switch circuit 1004. For example, a logic "0" applied to TM input 520 can indicate test mode, and a logic "1" applied to TM input 520 can indicate normal mode.

Figure 11:
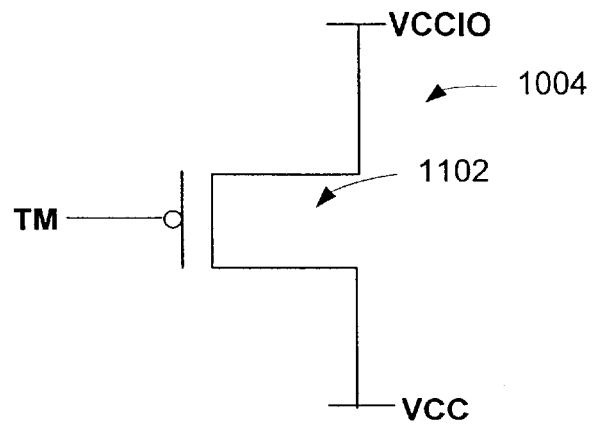
FIG. 11 is a circuit diagram of a portion of the multi-die package and test platform shown in FIG. 10.

With reference now to FIG. 11, in one configuration, switch 1004 includes a PMOS transistor 1102 formed on controller die 508 (FIG. 10). It should be recognized that switch circuit 1004 can include various devices either on or off controller die 508 (FIG. 10).

Figure 12:
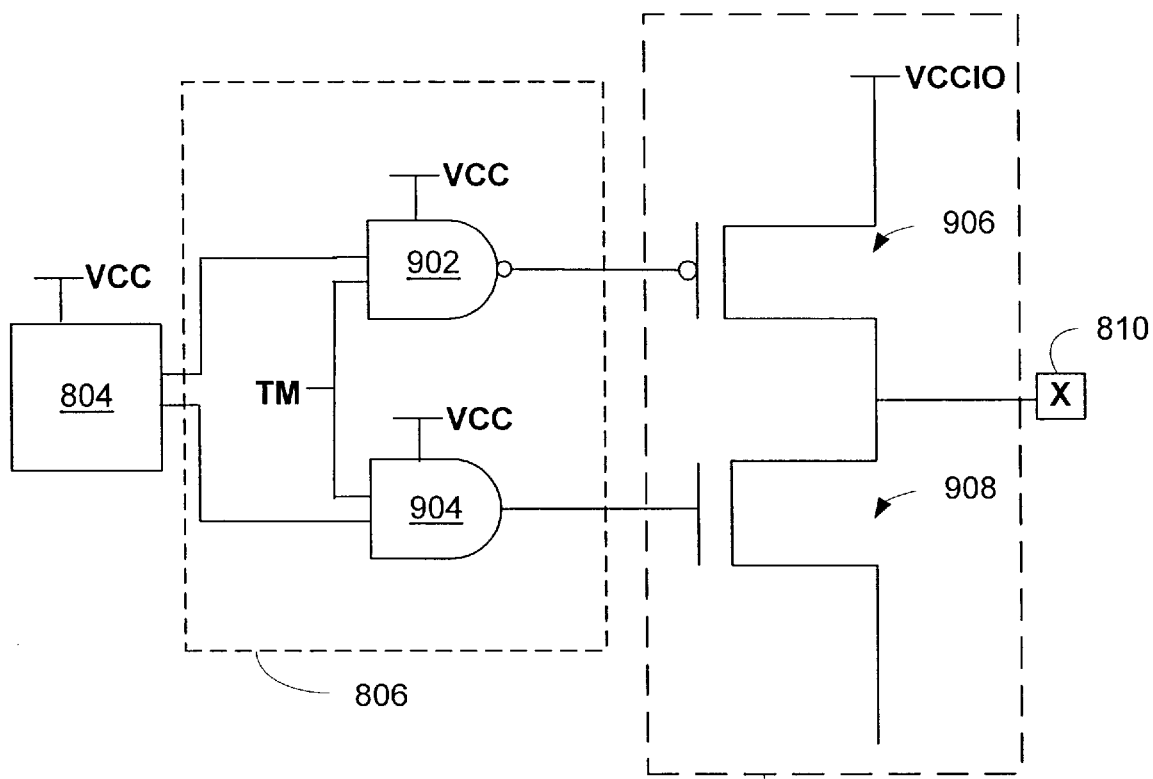
FIG. 12 is a partial block and circuit diagram of another portion of the multi-die package and test platform shown in FIG. 11.

With reference now to FIG. 12, when switch circuit 1004 (FIG. 11) is enabled with power supplied to VCCIO input 518 (FIG. 10) and VCC input 516 (FIG. 10) connected to N.C. on test platform 100, control circuit 806 tri-states I/O pin 810. It should be recognized, however, that power can be supplied to VCC input 516 (FIG. 10) and VCCIO input 518 (FIG. 10) can be connected to N.C. As such, in the present embodiment, switch circuit 1004 can power up both VCC and VCCIO from a single channel through lead 120 (FIG. 10) connected to tester 122 (FIG. 10). In this manner, all of the I/O pins of controller die 508 (FIG. 10) can be tri-stated. As alluded to earlier, it should be recognized that controller die 508 (FIG. 10) can include any number of I/O pins.

As depicted in FIG. 12, in this configuration, control circuit 806 can be driven by VCC rather than VCCIO. As alluded to earlier, VCC can be more stable than VCCIO. This can be advantageous in some applications during normal mode operation.

Figure 13:
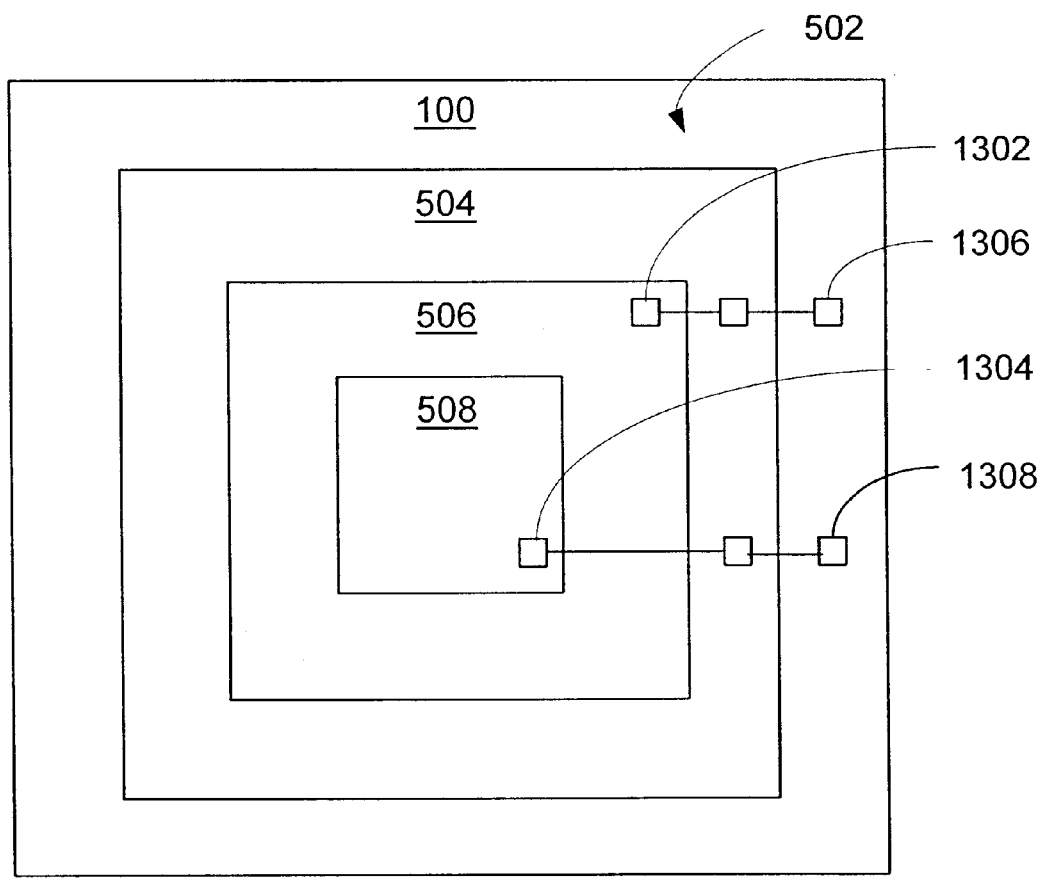
FIG. 13 is a top view of still another configuration of the multi-die package and test platform shown in FIG. 5.

With reference now to FIG. 13, in accordance with still another embodiment of the present invention, the high voltage pads (e.g., pads configured to handle voltages around 5 or 12 Volts) of FLASH die 506 are separated on substrate 504. For normal mode operation, these pads are then connected together. Additionally, other pads that are not high voltage are connected on substrate 504.

Figure 14:
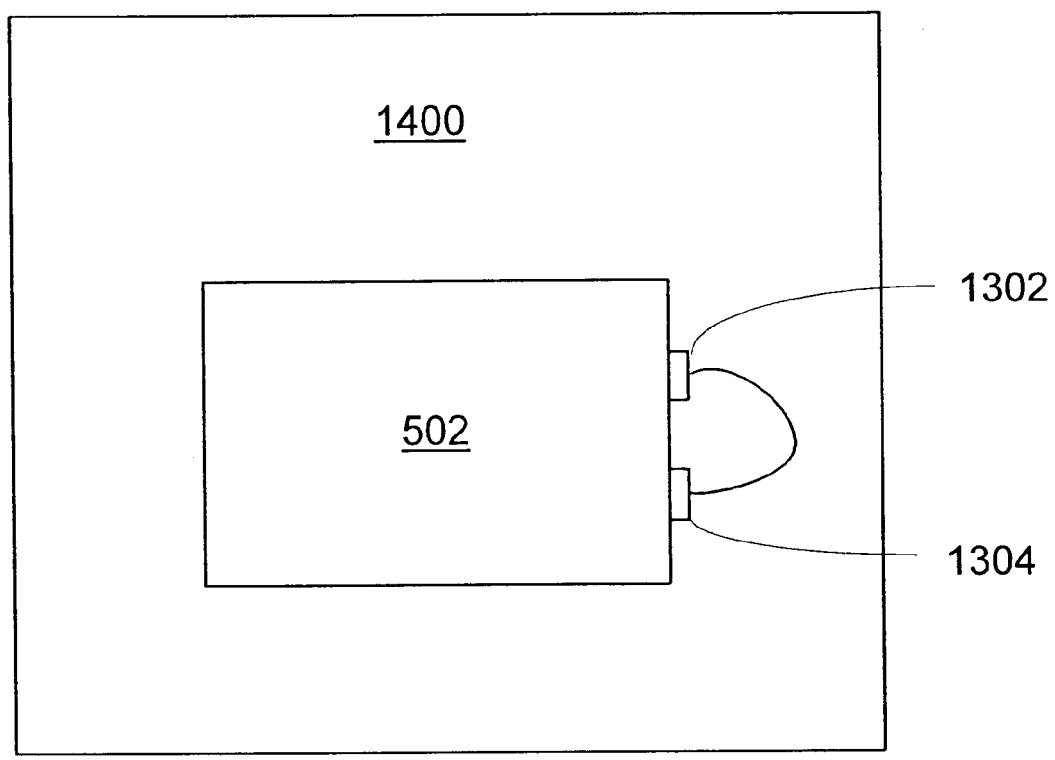
FIG. 14 is a block diagram of the multi-die package shown in FIG. 13.

More particularly, as depicted in FIG. 13, a high-voltage pad 1302 on FLASH die 506 can be connected to a first-high-voltage lead 1306. A non-high-voltage pad 1304 on controller die 508 can be connected to a lead 1308. In general, high-voltage pad 1302 of FLASH die 506 can be driven to voltages of about 5 volts and about 12 volts. But pad 1304 of controller die 508 can be driven to voltages of about 3 volts. In general high voltages of greater than 3 volts cannot be tolerated by the I/O drivers of controller die 508. As such, in this configuration, high voltage pad 1302 of FLASH die 506 and pad 1304 of controller die 508 can be tested separately. As depicted in FIG. 14, after testing, high voltage pad 1302 and pad 1304 can then be connected at a system level 1400 by user application rather than at a substrate level.

Although the present invention has been described in conjunction with particular embodiments illustrated in the appended drawing figures, various modifications can be made without departing from the spirit and scope of the invention. Therefore, the present invention should not be construed as limited to the specific forms shown in the drawings and described above.

We claim:

1. A method for isolating a die in testing a multi-die package having a first die and a second die, the first die having a VCC input, and the second die having a supply voltage (VCC) input, an I/O supply voltage (VCCIO) input, and at least one input/output (I/O) pin connected to an I/O buffer having a driver and a pre-driver, said method comprising:

disposing the multi-die package in a test platform, wherein said test platform includes a first lead and a second lead;

connecting said first lead to the VCC input on the first die;

connecting said second lead to the VCCIO input on the second die;

connecting the VCC input on the second die to ground; and tri-stating the I/O pin of the second die using a control circuit disposed between the pre-driver and the driver of the I/O buffer.

2. The method of claim 1 further comprising:

connecting a test-mode-enable input on the second die to ground.

3. The method of claim 1 further comprising:

sensing the test mode using a test-mode-enable input on the second die; and enabling a switch on the second die, wherein said switch connects between VCC and VCCIO.

4. The method of claim 3, wherein said switch includes a PMOS transistor.

5. The method of claim 1, wherein said control circuit comprises:

a NAND gate connected to a p-channel transistor in the driver of the output buffer; and a AND gate connected to an n-channel transistor in the driver of the output buffer.

6. The method of claim 1, wherein said first die is a FLASH memory die.

7. The method of claim 1, wherein said second die is a controller die.

8. The method of claim 1 further comprising:

separating any high voltage pins on the first die from any pins on the second die.

9. The method of claim 8, wherein said separating comprises:

connecting any high voltage pins on the first die to a first set of leads on said test platform, wherein said first set of leads are configured to be high-voltages leads; and connecting any pins on the second die to a second set of leads on said test platform, wherein said first said second sets of leads on said test platform are isolated from each other.

10. A test platform for testing a multi-die package having a first die and a second die, the first die having a VCC input, and the second die having a VCC input, an I/O supply voltage (VCCIO) input, and at least one input/output (I/O) pin connected to an I/O buffer having a driver and a pre-driver, said test platform comprising:

a first lead connected to the VCC input on the first die;

a second lead connected to the VCCIO input on the second die;

a control circuit disposed between the pre-driver and the driver of the I/O pin, wherein said control circuit is configured to tri-state the I/O pin.

11. The test platform of claim 10 further comprising a switch circuit disposed on said second die, wherein said switch circuit is configured to switch between VCC and VCCIO.

12. The test platform of claim 11, wherein said switch circuit includes a PMOS transistor.

13. The test platform of claim 10, wherein said control circuit comprises:

a NAND gate connected to a p-channel transistor on the driver; and a AND gate connected to an n-channel transistor on the driver.

14. The test platform of claim 10, wherein the first die is a FLASH memory die.

15. The test platform of claim 10, wherein the second die is a controller die.

16. A method of testing a multi-die package having a first die and a second die on a substrate, the first die having a VCC input, and the second die having a VCC input, an I/O supply voltage (VCCIO) input, and a test-mode-enable (TM) input, said method comprising:

inserting the multi-die package in a test platform having a first-VCC lead and a second-VCC lead;

connecting the VCC input of the first die, the VCC input of the second die, and the VCCIO input of the second die to a bonding terminal on said substrate;

connecting said first-VCC lead to said bonding terminal; and connecting said second-VCC lead to the TM input of said second die.

17. The method of claim 16 further comprising:

connecting said first-VCC lead and said second-VCC lead to a tester; and sending test signals to the first die.

18. The method of claim 16, wherein said first die is a FLASH die and said second die is a controller die.

19. A method of isolating a controller die while testing a FLASH die, wherein the controller die and the FLASH die are mounted in a multi-die package, wherein the controller die has a VCC input, an I/O supply voltage (VCCIO) input, and at least one input/output (I/O) pin, wherein the FLASH die has a VCC input, said method comprising:

connecting the multi-die package in a test platform having a first lead and a second lead;

connecting said first lead to the VCC input on the FLASH die;

connecting said second lead to the VCCIO input on the controller die;

tri-stating the I/O pin of the controller die using a control circuit, wherein the control circuit comprises:

a NAND gate connected to a p-channel transistor in an I/O buffer connected to the I/O pin; and a AND gate connected to an n-channel transistor in the I/O buffer connected to the I/O pin.

20. The method of claim 19 further comprising:

sensing the test mode using a test-mode-enable (TM) input on the controller; and enabling a switch on the controller, wherein said switch is a PMOS transistor having a VCC terminal and a VCCIO terminal.

\* \* \* \* \*